US006489209B1

(12) United States Patent
Shimoji

(10) Patent No.: US 6,489,209 B1

(45) **Date of Patent: *Dec. 3, 2002**

(54) MANUFACTURING METHOD OF LDD-TYPE MOSFET

(75) Inventor: Noriyuki Shimoji, Kyoto (JP)

(73) Assignee: NGB Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 07/924,840

(22) Filed: Aug. 4, 1992

(30) Foreign Application Priority Data

Aug. 22, 1991 (JP) ............................................ 3-210791
Aug. 22, 1991 (JP) ............................................ 3-210792

(51) Int. Cl.[7] ............................................ H01L 21/336

(52) U.S. Cl. ........................ 438/305; 438/529; 438/923

(58) Field of Search ............................. 437/27, 28, 29, 437/30, 44, 45, 978; 148/DIG. 43; 438/303, 305, 306, 307, 527, 529, 595, 923

(56) References Cited

U.S. PATENT DOCUMENTS 4,760,033 A * 7/1988 Mueller ...................... 438/305
4,855,247 A * 8/1989 Ma et al. ...................... 437/44
4,954,867 A * 9/1990 Hosaka ........................ 437/44
5,089,432 A * 2/1992 Yoo ............................ 437/44
5,091,763 A * 2/1992 Sanchez ...................... 437/29

OTHER PUBLICATIONS

Wolf, "Silicon Processing for the VLSI Era", vol. 1, 1986, pp. 182–183.*

Wolf, "Silicon Processing for the VLSI Era", 1986, vol. 1, Process Technology, pp. 321–325.*

* cited by examiner

*Primary Examiner*—Chandra Chaudhari
(74) *Attorney, Agent, or Firm*—Baker Botts, LLP

(57) ABSTRACT

After a first insulating film is formed only on the top surface or at least on the entire surface of a polysilicon gate electrode, first impurity ions are implanted into a semiconductor substrate from above the entire substrate to provide lightly doped source and drain regions. Then, after vertical layers are formed at the sides of the gate electrode and a second insulating film is formed at least on the top surface of the gate electrode, second impurity ions are implanted from above the entire semiconductor substrate to provide heavily doped source and drain regions.

6 Claims, 5 Drawing Sheets

9 11 1 12 2 10 8 14 13 16 15 3 6 5

MANUFACTURING METHOD OF LDD-TYPE MOSFET

BACKGROUND OF THE INVENTION

The present invention relates to a manufacturing method of an LDD (lightly doped drain)-type MOS transistor, which method is intended to prevent the undesired phenomenon that impurity ions penetrate through a gate electrode to reach a channel region when they are introduced into source and drain regions.

Conventional methods of manufacturing semiconductor devices of the above type are associated with the problem that impurity ions pass through a gate electrode to reach a channel region when impurity ions are implanted into source and drain regions in such cases that the gate electrode is thin or made of polysilicon, or an acceleration voltage of the ion implantation is high.

In the case of a gate electrode made of polysilicon, since its crystal grains usually have a pillar-like structure, ions incidentally launched into a crystal grain boundary do not remain within the gate electrode but reach the channel region. As a result, the impurity concentration in the channel region is locally-reduced, to decrease the threshold voltage $V_{th}$.

Further, the conventional manufacturing methods encounter the following problem when the polysilicon gate electrode is employed that is heavily doped to provide n- or p-type conduction. If the source and drain regions are to be doped to provide a conduction type opposite to that of the gate electrode, impurity ions for the source and drain regions that are mixed into the gate electrode will increase the resistance of the gate electrode.

SUMMARY OF THE INVENTION

The present invention has been made to solve the above problems in the art, and has an object of providing a manufacturing method of the above type of semiconductor device, in which method, in implanting impurity ions into source and drain regions, their introduction into a channel region through a gate electrode can be avoided and the degree of their introduction into the gate electrode is reduced.

According to the invention, a manufacturing method of a field effect transistor comprises the steps of:

forming a gate electrode on a semiconductor substrate;

forming an insulating film only on a top surface or at least on the entire surface of the gate electrode; and implanting impurity ions into source and drain regions from above the entire semiconductor substrate.

The above manufacturing method may further comprises the steps of:

forming vertical layers adjacent to side surfaces of the gate electrode;

forming a second insulating film at least on the top surface of the gate electrode; and implanting second impurity ions into the source and drain regions from above the entire semiconductor substrate.

With the above manufacturing method, since impurity ions go through at least one amorphous layer, where they are scattered, the possibility that impurity ions penetrate through the crystal grain boundaries of the polysilicon gate electrode becomes extremely small. In the case of implanting ions to produce p-type source and drain regions in an n-type Si substrate in a $BF_2$ atmosphere under the conditions of, for instance, E=70 keV and Q=$5\times10^{15}$ $cm^{-2}$, an oxide film of 60 nm in thickness that is formed on the gate electrode can interrupt 50% of the ions because the projected range of the ions is about 60 nm.

DESCRIPTION OF THE PREFERRED EMBODIMENTS

Figure 1:
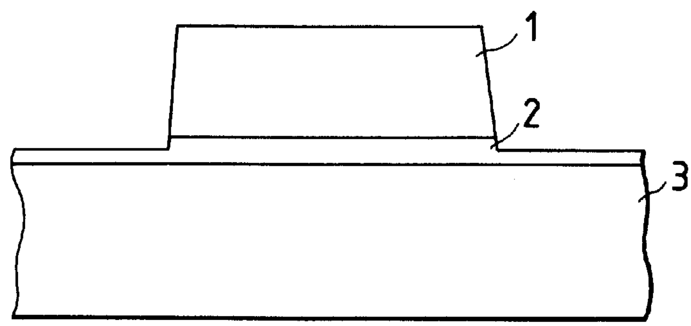
FIGS. 1–7 are sectional views showing first through seventh steps of a manufacturing method according to an embodiment of the invention.

Embodiments of the present invention are described hereinafter with reference to the accompanying drawings.

FIGS. 1–7 show steps of a semiconductor device manufacturing method according to an embodiment of the invention. In FIGS. 1–7, reference numeral 3 represents a semiconductor (Si) substrate; 2, an insulating film; 1, a conductive layer constituting a gate electrode; 4, a first insulating film covering the entire conductive layer 1; 5 and 6, first diffusion layers; 7–9, CVD films; 12, a second insulating film formed on the conductive layer 1; and 15 and 16, second diffusion layers.

In step 1, as shown in FIG. 1, the insulating film 2 is formed on the semiconductor substrate 3, and then the conductive layer 1 constituting the gate electrode is formed on the insulating film 2.

In the present embodiment, the semiconductor substrate 3 is typically a p-type substrate that has been doped to have a surface concentration of about $1\times10^{16}$ $cm^{-3}$. The insulating film 2 is a $SiO_2$ film having a thickness 10–40 nm. The conductive layer 1 is formed to have a thickness of 200–500 nm. The insulating film 2 has steps that have been produced by over-etching in forming the conductive layer 1.

The semiconductor substrate 3 may be an n-type substrate, or a p-well formed in an n-type substrate or an n-well formed in a p-type substrate.

The conductive layer 1 is typically made of heavily doped polysilicon. Alternatively, it may be what is called a polycide that has a two-layer structure of polysilicon and silicide (e.g., WSi and MoSi).

Figure 2:
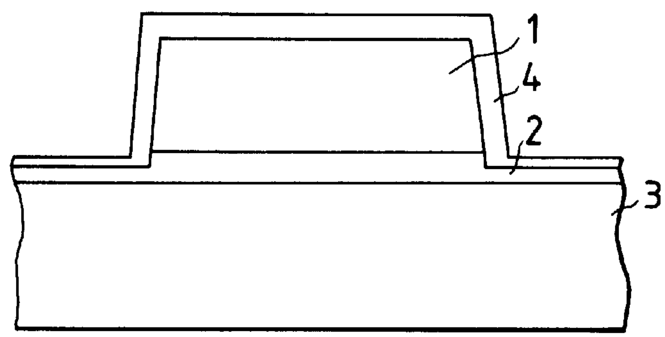

In step 2, as shown in FIG. 2, the first insulating film 4 is formed so as to cover the conductive layer 1. In the present embodiment, the first insulating film 4 is typically a $SiO_2$ layer formed by thermal oxidation and has a thickness of 30–70 nm (on the conduction layer 1). Alternatively, the first insulating film 4 may be formed by the CVD (chemical vapor deposition) method.

Figure 3:
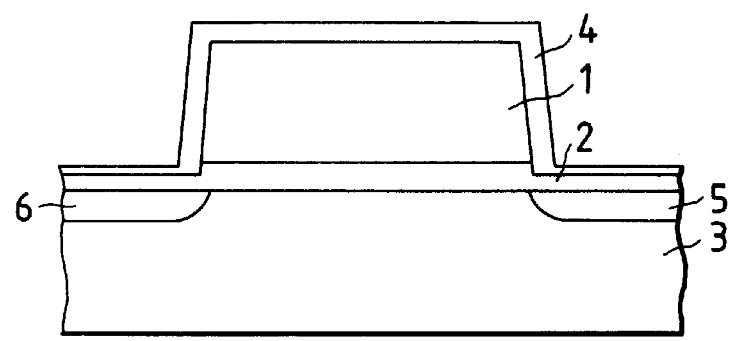

In step 3, as shown in FIG. 3, the diffusion layers 5 and 6 are formed in the semiconductor substrate 3 so as to have a conduction type opposite to that of the substrate 3. In the present embodiment, phosphorus ions are implanted under the conditions of E=40–70 keV and Q=1–$5\times10^{13}$ $cm^{-2}$. Completely interrupted by the first insulating film 4 and the conductive layer 1, phosphorus ions never reach the channel region surface of the semiconductor substrate 3. The implanted ions diffuse to reach the vicinity of the edges of the conductive layer 1 in an annealing process that is performed after the above ion implantation.

Figure 4:
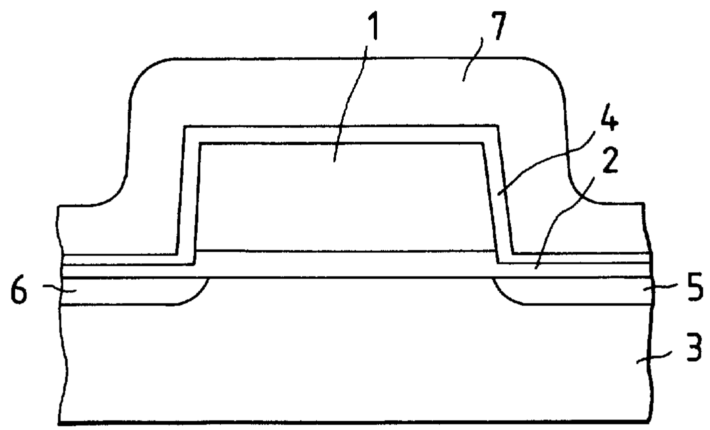

In step 4, as shown in FIG. 4, the CVD film 7 is formed so as to cover the diffusion layers 5 and 6, conductive layer 1 and semiconductor substrate 3. In the present embodiment, the CVD film 7 is typically a $SiO_2$ film formed by the CVD method and having a thickness of 200–400 nm. Alternatively, it may be a conductive film such as a polysilicon film.

Figure 5:
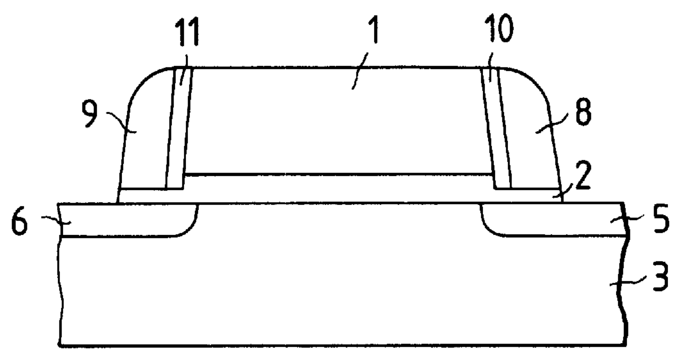

In step 5, as shown in FIG. 5, vertical layers 8 and 9 for partially covering the respective diffusion layers 5 and 6 are formed adjacent to residual first insulating films 10 and 11 at the sides of the conductive layer 1 by performing anisotropic etching on the entire $SiO_2$ film 7 (etching back method). Since the $SiO_2$ film 7 is thicker at the sides of the conductive layer 1 than in the other portions, the $SiO_2$ vertical layers 8 and 9 remain together with the first insulating films 10 and 11 by etching the $SiO_2$ film 7 by a distance equal to its thickness in the other portions.

Figure 6:
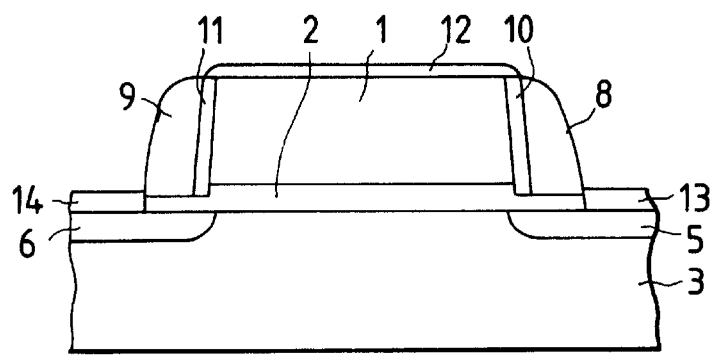

In step 6, as shown in FIG. 6, a $SiO_2$ film (i.e., second insulating films 12–14) is formed on the conductive layer 1 and the exposed portions of the diffusion layers 5 and 6. The second insulating films 12–14 serve to prevent ions from penetrating through the conductive layer 1 to be introduced into the channel region in a subsequent ion-implanting process, and to recover the damaged surfaces of the Si substrate 3 that have been damaged in the above etching back process. No second insulating film is formed on the vertical layers 8 and 9.

Figure 7:
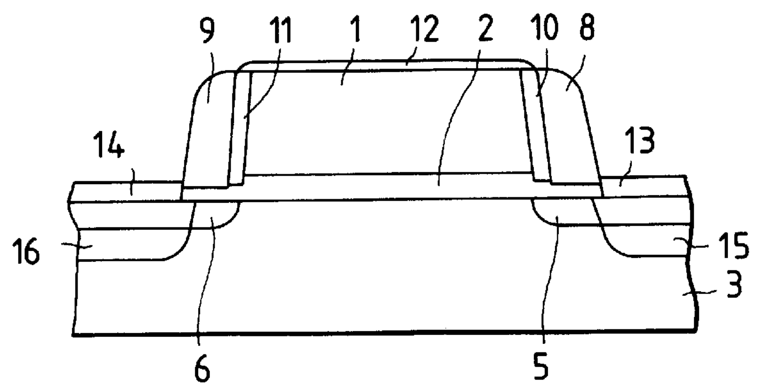

In final step 7, as shown in FIG. 7, heavily doped layers 15 and 16 are formed by ion implantation with the vertical layers 8 and 9, insulating films 10–12 and conductive layer 1 used as a mask. In the present embodiment, arsenic ions are implanted under the conditions of E=70–100 keV and $Q=3\text{–}5\times10^{15}\ cm^{-2}$ so that they positively penetrate the second insulating films 13 and 14 while not penetrating the conductive layer 1, and that resulting diffusion layers have a sufficiently small resistance. Subsequently, the implanted impurities are activated by an annealing process that is performed in a nitrogen atmosphere at 900° C. for about 30 minutes. Thus, the LDD-type MOS transistor is produced.

Figure 8:
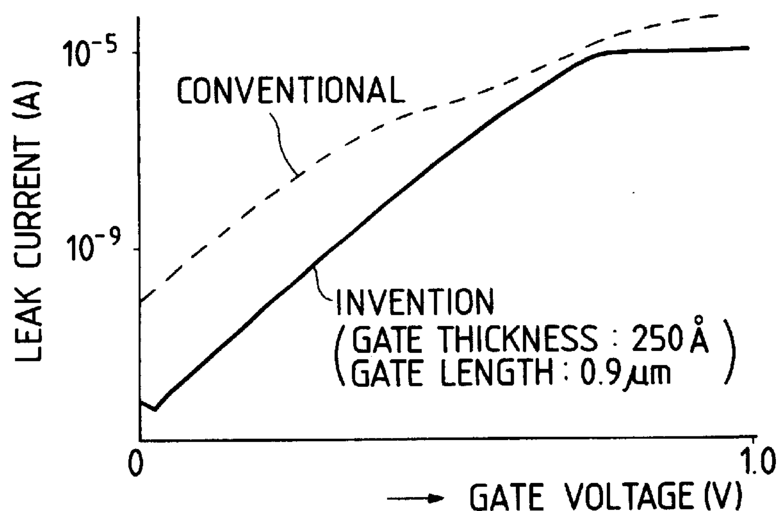
FIG. 8 is a graph showing a relationship between the gate voltage and the leak current.

FIG. 8 shows measurement results of the relationship between the gate voltage and the leak current in a transistor produced by the above-described process and a conventional transistor. It is understood that the leak current is reduced in the transistor of the invention which has the first and second insulating films.

FIGS. 9–15 show steps of a semiconductor device manufacturing method according to another embodiment of the invention. In FIGS. 9–15, reference numeral 24 represents a semiconductor (Si) substrate; 23, a gate oxide film; 22, a conductive layer constituting a gate electrode; 21, a $SiO_2$ first insulating film formed on the conductive layer 22; 25 and 26, phosphorus first diffusion layers; 27–29, CVD films; 30, a $SiO_2$ second insulating film formed on the conductive layer 22; and 33 and 34, arsenic second diffusion layers.

Figure 9:
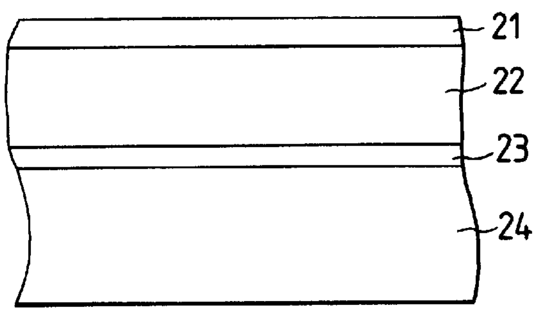
FIGS. 9–15 are sectional views showing first through seventh steps of a manufacturing method according to another embodiment of the invention.

In step 1, as shown in FIG. 9, the insulating film (gate oxide film) 23 is formed on the semiconductor substrate 24, the conductive layer 22 to be shaped into the gate electrode is formed on the insulating film 24, and then the $SiO_2$ first insulating film 21 is formed on the conductive layer 22. In the present embodiment, the semiconductor substrate 24 is a p-type substrate having a surface concentration of about $1\times10^{16}\ cm^{-3}$, and the insulating film 23 is a $SiO_2$ film having a thickness of 10–40 nm. The conductive layer 22 is typically a heavily doped n-type polysilicon. Alternatively, it may be what is called a polycide having a two-layer structure of polysilicon and silicide (e.g., WSi and MoSi). The thickness of the conductive layer 22 is selected to be within the range of 0.2–0.5 $\mu$m. The first insulating film 21 is typically a $SiO_2$ film formed by the CVD method, and may be a $SiO_2$ film formed by thermally oxidizing polysilicon.

Figure 10:
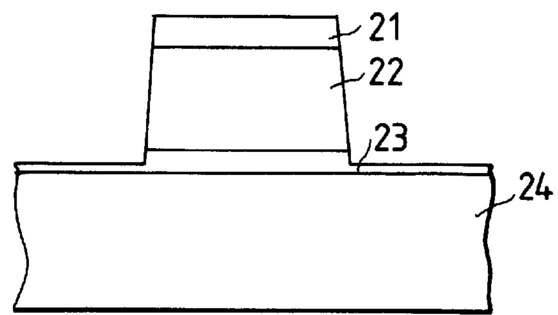

In step 2, as shown in FIG. 10, the first insulating film 21 and the conductive layer 22 are shaped by a photolithography process consisting of resist pattern formation and dry etching. Steps are formed in the insulating film 23 by over-etching.

Figure 11:
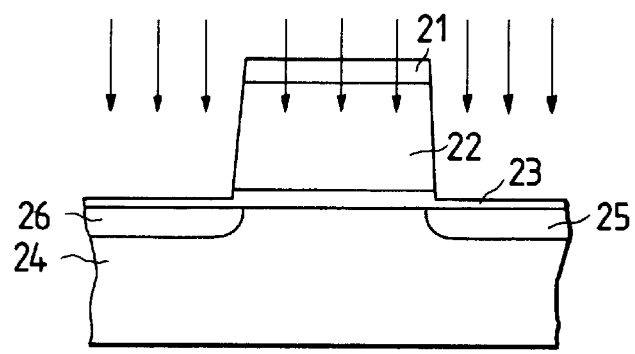

In step 3, as shown in FIG. 11, phosphorus ions are implanted into the semiconductor substrate 24 to produce the first diffusion layers 25 and 26 having a conduction type opposite to that of the substrate 24. In the present embodiment, the ion implantation is performed under the conditions of E=70 keV and $Q=1\times10^{13}\ cm^{-2}$. In this ion implantation, ions are completely prevented by the first insulating film 21 and the conductive layer 22 from entering the channel region. The implanted ions in the first diffusion layers 25 and 26 diffuse to reach the vicinity of the edges of the conductive layer 22 in an annealing process that is performed after the above ion implantation.

Figure 12:
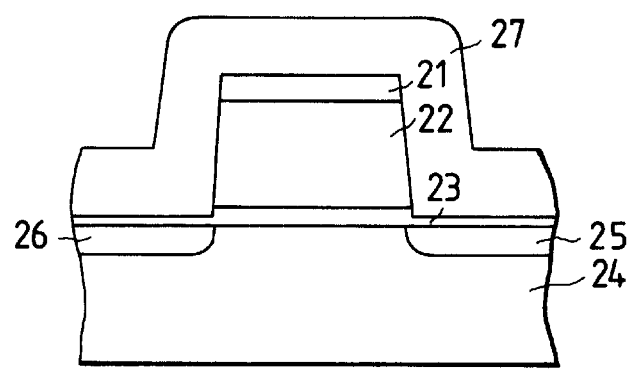

In step 4, as shown in FIG. 12, the CVD insulation film 27 is formed so as to cover the diffusion layers 25 and 26, conductive layer 22 and semiconductor substrate 24. In the present embodiment, the CVD film 27 is typically a $SiO_2$ film formed by the CVD method and having a thickness of about 0.4 $\mu$m. Alternatively, it may be a conductive film such as a polysilicon film.

Figure 13:
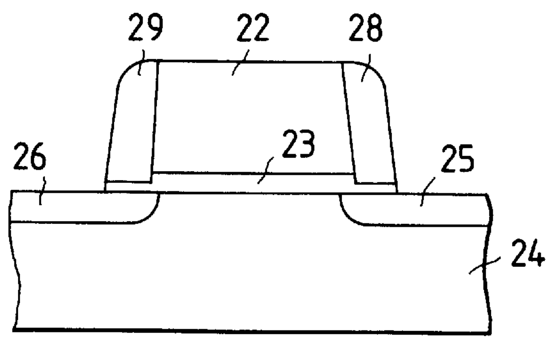

In step 5, as shown in FIG. 13, vertical layers 28 and 29 are formed as residual portions of the insulating film 27 located at the sides of the conductive layer 22, so as to cover the portions of the respective first diffusion layers 25 and 26 that are adjacent to the conductive layer 22. The vertical layers 25 and 26 are formed by performing anisotropic dry etching on the entire $SiO_2$ film 27 (etching back method). Since the $SiO_2$ film 27 is thicker at the sides of the conductive layer 22 than in the other portions, the $SiO_2$ vertical layers 28 and 29 remain by etching the $SiO_2$ film 27 by a distance equal to its thickness in the other portions.

Figure 14:
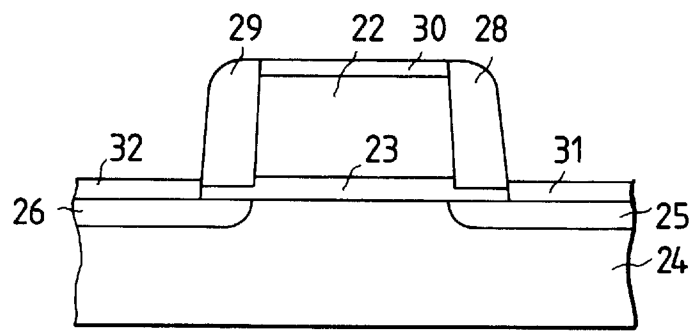

In step 6, as shown in FIG. 14, $SiO_2$ films 30–32 are formed on the conductive layer 22 and the exposed portions of the first diffusion layers 25 and 26. The $SiO_2$ films 30–32 can easily be formed by the thermal oxidation method, and serve to prevent ions from penetrating through the conductive layer 22 to enter the channel region in a subsequent ion-implanting process, and to recover the damaged surfaces of the Si substrate 24 that have been damaged in the above etching back process. The $SiO_2$ films 30–32 as the second insulating films have a thickness of about 20 nm on the Si substrate 24.

Figure 15:
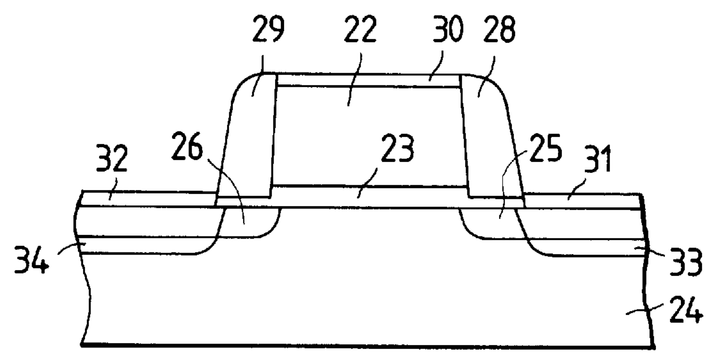

In final step 7, as shown in FIG. 15, the second diffusion layers 33 and 34 are formed by ion implantation with the vertical layers 28 and 29, conductive layer 22 and insulating film 30 as a mask. In the present embodiment, arsenic ions are implanted under the conditions of E=70 keV and $Q=5\times10^{15}\ cm^{-2}$ so that they penetrate the second insulating films 31 and 32 but do not penetrate the conductive layer 22, and that the resistance of the second diffusion layers 33 and 34 is sufficiently reduced. Subsequently, the implanted impurities are activated by an annealing process that is performed in a nitrogen atmosphere at 900° C. for about 30 minutes. Thus, the LDD-type MOS transistor is produced.

It has been confirmed that transistors manufactured in accordance with the second embodiment and having the above-described first and second insulating films have a leak current smaller than conventional transistors.

As described in the foregoing, according to the semiconductor manufacturing method of the invention, first impurity ions are implanted into the semiconductor substrate from above the entire substrate after the first insulating film is formed only on the top surface or at least on the entire surface of the gate electrode that is provided on the semiconductor-substrate to assume a protrusion. Then, after the CVD layers are formed at the sides of the gate electrode and the second insulating film is formed at least on the top surface of the gate electrode, the second impurity ions are implanted from above the entire semiconductor substrate. The transistor manufactured according to the above method has the following advantages. By virtue of the existence of the first and second insulating films, ions are prevented from penetrating through the gate electrode to be introduced into the channel region when they are implanted into the source and drain regions, and the reduction of the threshold voltage $V_{th}$ can be avoided, which contribute to the improvement of the production yield. Further, since the degree of ion introduction into the gate electrode is reduced in the process of implanting impurity ions into the source and drain regions, the resistance of the gate electrode typically made of polysilicon can be kept low, to assure a high-speed operation of the transistor.

What is claimed is:

1. A manufacturing method of a field effect transistor, comprising the steps of:

forming a first $SiO_2$ insulating film on a semiconductor substrate;

forming a gate electrode on the first $SiO_2$ insulating film;

forming a second $SiO_2$ insulating film to cover a top surface of the gate electrode and adjacent source and drain regions of the semiconductor substrate while controlling the thickness of the second $SiO_2$ insulating film so that, together with that of the gate electrode, the thickness is great enough to prevent subsequently-implanted impurity ions from affecting the region of the semiconductor substrate beneath the gate electrode and small enough to permit the same impurity ions to be implanted through the film into the source and drain regions;

implanting impurity ions into source and drain regions of the substrate by exposing the entire semiconductor substrate including the gate electrode and the source and drain regions covered by the second $SiO_2$ insulating film from above directly to a source of impurity ions thereby permitting the impurity ions to be implanted in the source and drain regions while preventing them from affecting the region beneath the gate electrode;

forming a third insulating film on the sides of the gate electrode;

forming a fourth insulating film on the top of the gate electrode; and implanting further impurity ions into portions of the source and drain regions by exposing the entire semiconductor substrate including the gate region having the third and fourth insulating films to a source of impurity ions, thereby permitting the further impurity ions to be implanted into the portions of the source and drain regions not covered by the third insulating film while preventing them from affecting the region beneath the gate electrode.

2. A manufacturing method according to claim 1 wherein the fourth insulating film is formed by thermal oxidation.

3. The manufacturing method of claim 1 wherein the insulating film is a $SiO_2$ film formed by chemical vapor deposition.

4. The manufacturing method of claim 1 wherein the second $SiO_2$ insulating film is formed by chemical vapor deposition.

5. The manufacturing method of claim 1, wherein the second $SiO_2$ insulating film is formed by thermally oxidizing a material of the gate electrode.

6. A manufacturing method according to claim 1, wherein the impurity ions are implanted through the first $SiO_2$ insulating film.

* * * * *

UNITED STATES PATENT AND TRADEMARK OFFICE

CERTIFICATE OF CORRECTION

PATENT NO. : 6,489,209 B1
DATED : December 3, 2002
INVENTOR(S) : Shimoji

It is certified that error appears in the above-identified patent and that said Letters Patent is hereby corrected as shown below:

Column 1,
Line 25, "locally-reduced," should read -- locally reduced, --
Line 52, "comprises" should read -- comprise --

Column 2,
Lines 1 and 58, "ke V" should read -- keV --

Column 3,
Line 30, "ke V" should read -- keV --

Column 4,
Lines 13 and 53, "ke V" should read -- keV --

Column 5,
Line 34, "subsequently-" should read -- subsequently --

Column 6,
Line 23, "electrode." should read -- electrode, wherein the fourth insulating film also covers the source and drain regions and the further impurity ions are implanted into those regions through insulating film. --

Signed and Sealed this

Seventeenth Day of June, 2003

JAMES E. ROGAN
*Director of the United States Patent and Trademark Office*

UNITED STATES PATENT AND TRADEMARK OFFICE

CERTIFICATE OF CORRECTION

PATENT NO. : 6,489,209 B1
DATED : December 3, 2002
INVENTOR(S) : Shimoji

It is certified that error appears in the above-identified patent and that said Letters Patent is hereby corrected as shown below:

Title page,
Item [73], Assignee: "NGB Corporation" should read -- Rohm Co., Ltd. --

Signed and Sealed this

Nineteenth Day of August, 2003

JAMES E. ROGAN
*Director of the United States Patent and Trademark Office*